United States Patent
Kim et al.

(10) Patent No.: US 9,666,262 B2
(45) Date of Patent: May 30, 2017

(54) SEMICONDUCTOR MEMORY DEVICE INCLUDING POWER DECOUPLING CAPACITOR

(71) Applicant: Samsung Electronics Co., Ltd., Suwon-si (KR)

(72) Inventors: Doo-young Kim, Seongnam-si (KR); Sung-hoon Kim, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 1116 days.

(21) Appl. No.: 13/792,820

(22) Filed: Mar. 11, 2013

(65) Prior Publication Data

US 2013/0242643 A1    Sep. 19, 2013

Related U.S. Application Data

(60) Provisional application No. 61/610,048, filed on Mar. 13, 2012.

(30) Foreign Application Priority Data

Feb. 6, 2013    (KR) .................. 10-2013-0013484

(51) Int. Cl.
*G11C 11/4063* (2006.01)
*G11C 5/14* (2006.01)
(Continued)

(52) U.S. Cl.
CPC ............ *G11C 11/4063* (2013.01); *G11C 5/14* (2013.01); *G11C 11/4074* (2013.01);
(Continued)

(58) Field of Classification Search
CPC ... G11C 5/14; G11C 11/4074; G11C 11/4063; H01L 23/5223; H01L 23/5286;
(Continued)

(56) References Cited

U.S. PATENT DOCUMENTS 7,462,912 B2    12/2008 Ahn et al.
2010/0065944 A1    3/2010 Tu et al.
(Continued)

FOREIGN PATENT DOCUMENTS

JP    2008-300765    12/2008
KR    1020030058642    7/2003
(Continued)

*Primary Examiner* — Selim Ahmed
(74) *Attorney, Agent, or Firm* — Myers Bigel, P.A.

(57) ABSTRACT

A semiconductor memory device includes a power decoupling capacitor (PDC) for preventing effective capacitance reduction during a high frequency operation. The semiconductor memory device includes the PDC to which a cell capacitor type decoupling capacitor is connected in series. The PDC includes a metal conductive layer electrically connected in parallel to a conductive layer formed on the same level as a bit line of a cell array region, wherein a plurality of decoupling capacitors in a first group and a plurality of decoupling capacitors in a second group are respectively connected to each other in parallel in a peripheral circuit region, and a storage electrode of the first group and a storage electrode of the second group are electrically connected to each other in series through the conductive layer.

20 Claims, 10 Drawing Sheets

(51) Int. Cl.
  *G11C 11/4074* (2006.01)
  *H01L 23/522* (2006.01)
  *H01L 23/528* (2006.01)
  *H01L 27/108* (2006.01)
  *H01L 49/02* (2006.01)

(52) U.S. Cl.
  CPC ...... *H01L 23/5223* (2013.01); *H01L 23/5286* (2013.01); *H01L 27/10817* (2013.01); *H01L 27/10852* (2013.01); *H01L 27/10894* (2013.01); *H01L 28/90* (2013.01); *H01L 2924/0002* (2013.01)

(58) Field of Classification Search
  CPC ......... H01L 27/10817; H01L 27/10852; H01L 27/10894; H01L 28/90
  See application file for complete search history.

(56) References Cited

U.S. PATENT DOCUMENTS

| | | | | |
|---|---|---|---|---|
| 2010/0078696 | A1* | 4/2010 | Kim | G11C 11/404 257/296 |
| 2010/0213573 | A1* | 8/2010 | Han | H01L 23/5223 257/532 |

FOREIGN PATENT DOCUMENTS

| | | |
|---|---|---|
| KR | 1020060134579 | 12/2006 |
| KR | 1020100036742 | 4/2010 |
| KR | 1020100042462 | 4/2010 |

\* cited by examiner

SEMICONDUCTOR MEMORY DEVICE INCLUDING POWER DECOUPLING CAPACITOR

CROSS-REFERENCE TO RELATED APPLICATIONS

This application claims the benefit of U.S. Provisional Patent Application No. 61/610,048, filed on Mar. 13, 2012, in the U.S. Patent and Trademark Office, and the benefit of Korean Patent Application No. 10-2013-0013484, filed on Feb. 6, 2013, in the Korean Intellectual Property Office, the disclosures of which are incorporated herein in their entirety by reference.

BACKGROUND

Embodiments of the inventive concept relate to a semiconductor memory device, and more particularly, to a semiconductor memory device including a power decoupling capacitor (PDC).

According to an increase of a degree of integration of a semiconductor memory device, such as dynamic random access memory (DRAM), demands for high storage capacity and high operation speed of the semiconductor memory device have increased. Also, the semiconductor memory device may include capacitors providing various functions.

When the degree of integration of the semiconductor memory device is increased, the number of operation circuits may be proportionally increased, and noise may be momentarily generated in an external power voltage VDD and a ground voltage VSS during read and write operations. Accordingly, the semiconductor memory device can include a PDC to filter noise between VDD and VSS. However, the effective capacitance of the PDC may be reduced in a high frequency operation.

SUMMARY

Embodiment of the inventive concept provide a semiconductor memory device including a power decoupling capacitor (PDC) for preventing effective capacitance reduction under a high frequency operation.

According to some embodiments of the inventive concept, there is provided a semiconductor memory device comprising: a cell array region comprising a cell transistor, a bit line electrically connected to a source/drain region of the cell transistor, and a cell capacitor; a peripheral circuit region comprising a plurality of decoupling capacitors formed on the same level as the cell capacitor of the cell array region, at a location spaced apart from the cell array region; and a power decoupling capacitor comprising a metal conductive layer electrically connected in parallel to a conductive layer formed on the same level as the bit line of the cell array region, wherein the plurality of decoupling capacitors in a first group and the plurality of decoupling capacitors in a second group are respectively connected to each other in parallel in the peripheral circuit region, and a storage electrode of the first group and a storage electrode of the second group are electrically connected to each other in series through the conductive layer. The conductive layer may be formed of the same material as the bit line.

According to further embodiments, a resistance component of the metal conductive layer may be smaller than a resistance component of the conductive layer.

According to various embodiments, the power decoupling capacitor may suppress fluctuation of an operation power voltage of the semiconductor memory device.

In some embodiments, a plate electrode of the first group may be electrically connected to a first power voltage and a plate electrode of the second group may be electrically connected to a second power voltage.

In other embodiments, the first power voltage may be any one of an external power voltage applied from outside the semiconductor memory device, an internal power voltage having a voltage level lower than the external power voltage, a high voltage having a voltage level higher than the external power voltage, and a back bias voltage, and the second power voltage is a ground voltage.

In some embodiments, the first power voltage may be an external power voltage applied from outside the semiconductor memory device, and the second power voltage may be an internal power voltage having a voltage level lower than the external power voltage or a high voltage having a voltage level higher than the external power voltage.

In further embodiments, the cell capacitor and the plurality of decoupling capacitors may each have a cylindrical structure. The cell capacitor and the plurality of decoupling capacitors may each have a pillar structure.

According to some embodiments of the inventive concept, there is provided a semiconductor memory device comprising: a cell array region comprising a cell transistor, a bit line electrically connected to a source/drain region of the cell transistor, and a cell capacitor; a peripheral circuit region comprising a plurality of decoupling capacitors formed on the same level as the cell capacitor of the cell array region, at a location spaced apart from the cell array region; and a power decoupling capacitor comprising a metal conductive layer electrically connected in parallel to a plate layer of a first group of the plurality of decoupling capacitors and a second group of the plurality of decoupling capacitors, wherein the plurality of decoupling capacitors in the first group and the plurality of decoupling capacitors in the second group are respectively connected to each other in parallel in the peripheral circuit region, and a plate electrode of the first group and a plate electrode of the second group are electrically connected to each other in series.

BRIEF DESCRIPTION OF THE DRAWINGS

Various embodiments of the inventive concept will be more clearly understood from the following detailed description taken in conjunction with the accompanying drawings in which.

DETAILED DESCRIPTION OF THE EMBODIMENTS

Embodiments of the inventive concept now will be described more fully hereinafter with reference to the accompanying drawings. This inventive concept may, however, be embodied in many different forms and should not be construed as limited to the embodiments set forth herein; rather, these embodiments are provided so that this disclosure will be thorough and complete, and will fully convey the scope of the inventive concept to those skilled in the art. In drawings, like numbers refer to like elements throughout and measurements of elements may be exaggerated for clarity.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "includes" and/or "comprises" when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein, the term "and/or" includes any and all combinations of one or more of the associated listed items.

As appreciated by the present inventors, the effective capacitance of a PDC may be reduced in a high frequency operation due to internal resistance when the memory device operates at high frequency. A technology for forming a power decoupling capacitor (PDC) having high capacity in a peripheral circuit region by using the same structure as a cell capacitor formed in a memory cell array region has been developed so as to form the PDC in a semiconductor memory device. Specifically, a technology for simultaneously forming a cell capacitor and a PDC has been developed by employing a capacitor over bit line (COB) type storage node, wherein a capacitor is formed on a bit line, in a memory cell array region.

Figure 1:
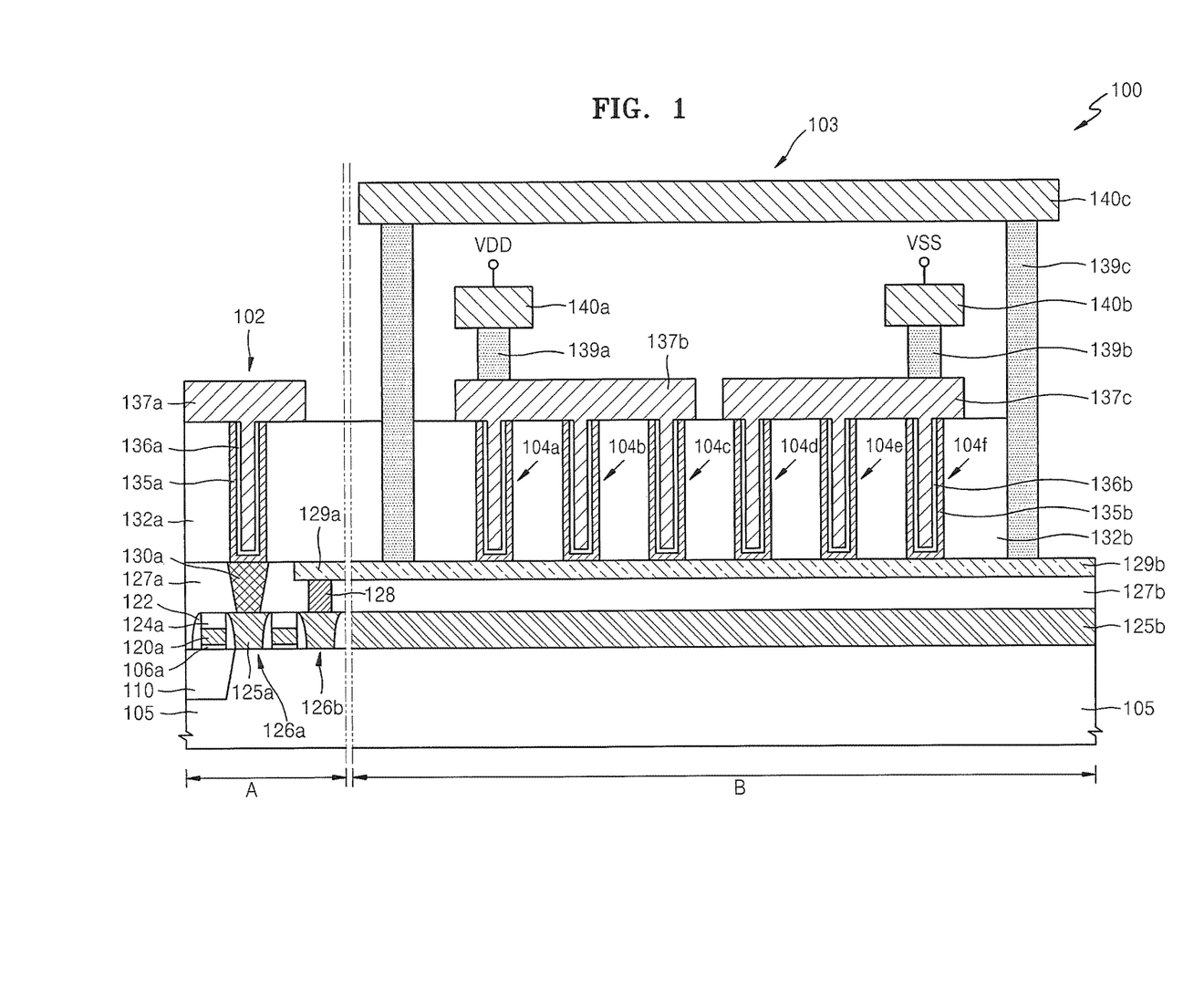
FIG. 1 is a diagram for describing a semiconductor memory device including a power decoupling capacitor (PDC), according to various embodiments of the inventive concept.

FIG. 1 is a diagram for describing a semiconductor memory device 100 including a PDC 103, according to various embodiments of the inventive concept.

Referring to FIG. 1, the semiconductor memory device 100 includes a cell array region A where a cell capacitor 102 is formed, and a peripheral circuit region B where decoupling capacitors 104a through 104f are formed. The peripheral circuit region B is spaced apart from the cell array region A, near the cell array region A. The cell capacitor 102 and the decoupling capacitors 104a through 104f each have a cylindrical structure to improve capacitance. An area of a capacitor electrode is increased by the cylindrical structure, and the increased area increases the capacitance of a capacitor.

In the cell array region A, a plurality of gate electrodes 120a each forming a cell transistor, and a first source/drain 126a and a second source/drain 126b respectively formed on two sides of each gate electrode 120a are formed on a substrate 105. In the cell array region A, a self-align contact 125a is formed on each of the first source/drain 126a and the second source/drain 126b respectively on each side of the gate electrodes 120a. The self-align contact 125a is formed to be self-aligned by the gate electrode 120a and an insulating spacer 122 formed on opposite sidewalls of the gate electrode 120a, between each two adjacent gate electrodes 120a from among the gate electrodes 120a formed on the substrate 105.

The cell capacitor 102 is connected to the first source/drain 126a through the self-align contact 125a and a buried contact 130a. A bit line 129a is connected to the second source/drain 126b through the self-aligned contact 125a and a direct contact 128. The cell capacitor 102 includes a storage electrode 135a, a dielectric film 136a, and a first plate electrode 137a. The cell capacitor 102 may be formed on the same level as the decoupling capacitors 104a through 104f forming the PDC 103, on the substrate 105.

In the cell array region A, the buried contact 130a is formed through an interlayer insulating film 127a. In the cell array region A and the peripheral circuit region B, storage electrodes 135a and 135b are respectively formed on mold oxide films 132a and 132b. The buried contact 130a in the cell array region A is electrically connected to an active region of the substrate 105, in detail, the first source/drain 126a formed in the active region limited by a device separation region 110, through the self-align contact 125a self-aligned by the gate electrode 120a and the insulating spacer 122. A top surface of the gate electrode 120a is covered by a capping layer 124a. A bottom surface of the gate electrode 120a is on layer 106a.

In the peripheral circuit region B, a lower conductive layer 125b is formed on the same level as the self-align contact 125a in the cell array region A. The self-align contact 125a and the lower conductive layer 125b are simultaneously formed, and may be formed of the same material.

In the peripheral circuit region B, a first conductive layer 129b is stacked on the lower conductive layer 125b with an interlayer insulating film 127b therebetween. The first conductive layer 129b forms a middle node of the PDC 103. The first conductive layer 129b may be formed on the same level as the bit line 129a in the cell array region A, and of the same material as the bit line 129a. For example, the first conductive layer 129b may be formed of polysilicon.

In the peripheral circuit region B, each of the decoupling capacitors 104a through 104f includes the storage electrode 135b, a dielectric film 136b, and first and second plate electrodes 137b and 137c. The storage electrode 135b, the dielectric film 136b, and the first and second plate electrodes 137b and 137c formed in the peripheral circuit region B may be respectively formed on the same level as the storage electrode 135a, the dielectric film 136a, and the first plate electrode 137a formed in the cell array region A, and of the same material.

In the peripheral circuit region B, the number of decoupling capacitors 104a through 104f is exemplarily 6, which are connected in parallel by 3. In other words, in the decoupling capacitors 104a through 104c, the storage electrode 135b is connected to the first conductive layer 129b, and the first plate electrode 137b is connected to a first metal conductive layer 140a in parallel through a first metal contact 139a. In the decoupling capacitors 140d through 140f, the storage electrode 135b is connected to the first conductive layer 129b, and the second plate electrode 137c is connected to a second metal conductive layer 140b in parallel through a second metal contact 139b.

The first metal conductive layer 140a is electrically connected to a first power voltage, for example, an external power voltage VDD applied from outside the semiconductor memory device 100, and thus the external power voltage VDD is applied to the first plate electrode 137b. The second metal conductive layer 140b is electrically connected to a second power voltage, for example, a ground voltage VSS, and thus the ground voltage VSS is applied to the first plate electrode 137c. The first power voltage may be any one of the external power voltage VDD, an internal power voltage VINT having a voltage level lower than the external power voltage VDD, a high voltage VPP having a voltage level higher than the external power voltage VDD, or a back bias voltage VBB.

The decoupling capacitors 104a through 104c and the decoupling capacitors 104d through 104f are connected in series through the first conductive layer 129b. The PDC 103 have such a structure is called a two-stage cell type PDC, and has an equivalent circuit shown in FIG. 2.

Figure 2:
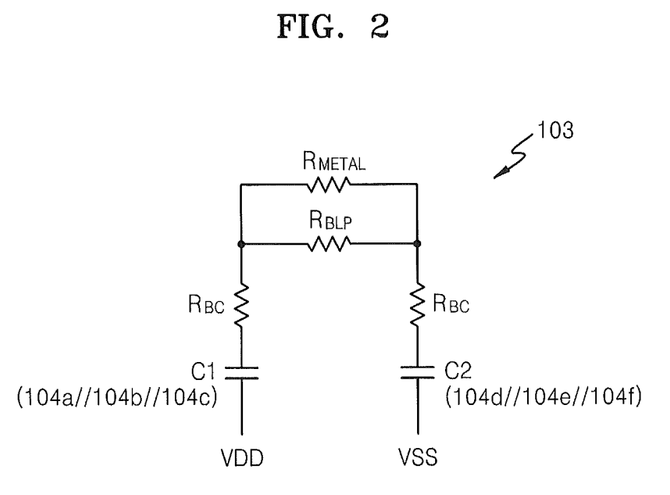
FIG. 2 is an equivalent circuit diagram of the PDC of FIG. 1, according to various embodiments.

FIG. 2 is an equivalent circuit diagram of the PDC of FIG. 1, according to various embodiments. Referring to FIG. 2, the PDC 103 includes a first capacitor C1 including the decoupling capacitors 104a through 104c connected in parallel, and a second capacitor C2 including the decoupling capacitors 104d through 104f connected in parallel. One terminal of the first capacitor C1 is electrically connected to the external power voltage VDD, and one terminal of the second capacitor C2 is electrically connected to the ground voltage (or other reference voltage) VSS. Other terminals of the first and second capacitors C1 and C2 correspond to the first conductive layer 129b of FIG. 1.

The first conductive layer 129b is connected to the storage electrodes 135b of the decoupling capacitors 104a through 104c and the decoupling capacitors 104d through 104f. A contact resistance component $R_{BC}$ between the storage electrode 135b and the first conductive layer 129b and a resistance component $R_{BLP}$ of the first conductive layer 129b are shown in the other terminals of the first and second capacitors C1 and C2. The first conductive layer 129b is formed on the same level as the bit line 129a in the cell array region A. During a manufacturing process of the bit line 129a, when a deposition thickness of the bit line 129a is decreased, a thickness of the first conductive layer 129b is also decreased. Accordingly, the resistance component $R_{BLP}$ of the first conductive layer 129b is increased.

In the PDC 103, when the resistance component $R_{BLP}$ of the first conductive layer 129b is increased, an effective capacitance of the PDC 103 may be decreased while the semiconductor memory device 100 operates at a high frequency. In order to prevent the effective capacitance of the PDC 103 from being decreased, a third metal conductive layer 140c of FIG. 1 for attenuating the resistance component $R_{BLP}$ of the first conductive layer 129b that is a middle node of the PDC 103 is connected to the first conductive layer 129b.

Referring back to FIG. 1, the third metal conductive layer 140c is connected to the first conductive layer 129b through a third metal contact 139c. The third metal conductive layer 140c may be formed on the same level as the first and second metal conductive layers 140a and 140b, and of the same material. The first through third metal conductive layers 140a through 140c may be formed of a conductive material having a lower resistance value than the resistance component $R_{BLP}$ of the first conductive layer 129b. For example, the first through third metal conductive layers 140a through 140c may be formed of gold (Au), aluminum (Al), chromium (Cr), nickel (Ni), tungsten (W), titanium (Ti), tantalum (Ta), TiW, NiCr, aluminum nitride (AlNx), TiNx, TiAlxNy, TaNx, tungsten silicide (WSix), TiSix, cobalt silicide (CoSix), or a combination thereof.

The third metal conductive layer 140c may be connected to the first conductive layer 129b in parallel. As shown in FIG. 2, a resistance component $R_{METAL}$ of the third metal conductive layer 140c is connected to the resistance component $R_{BLP}$ of the first conductive layer 129b in parallel so as to attenuate the resistance component $R_{BLP}$ of the first conductive layer 129b. Accordingly, the effective capacitance of the PDC 103 may be prevented from being decreased while the semiconductor memory device 100 operates at a high frequency.

In the current embodiment, the PDC 103 is connected between the external power voltage VDD and the ground voltage VSS so as to remove power noise. Alternatively, the PDC 103 may be used in a circuit that requires a large capacity capacitor. The PDC 103 may be used as a low pass filter for removing noise of a certain node voltage, or used as a kicker for pumping charges to generate a high voltage.

Figure 3:
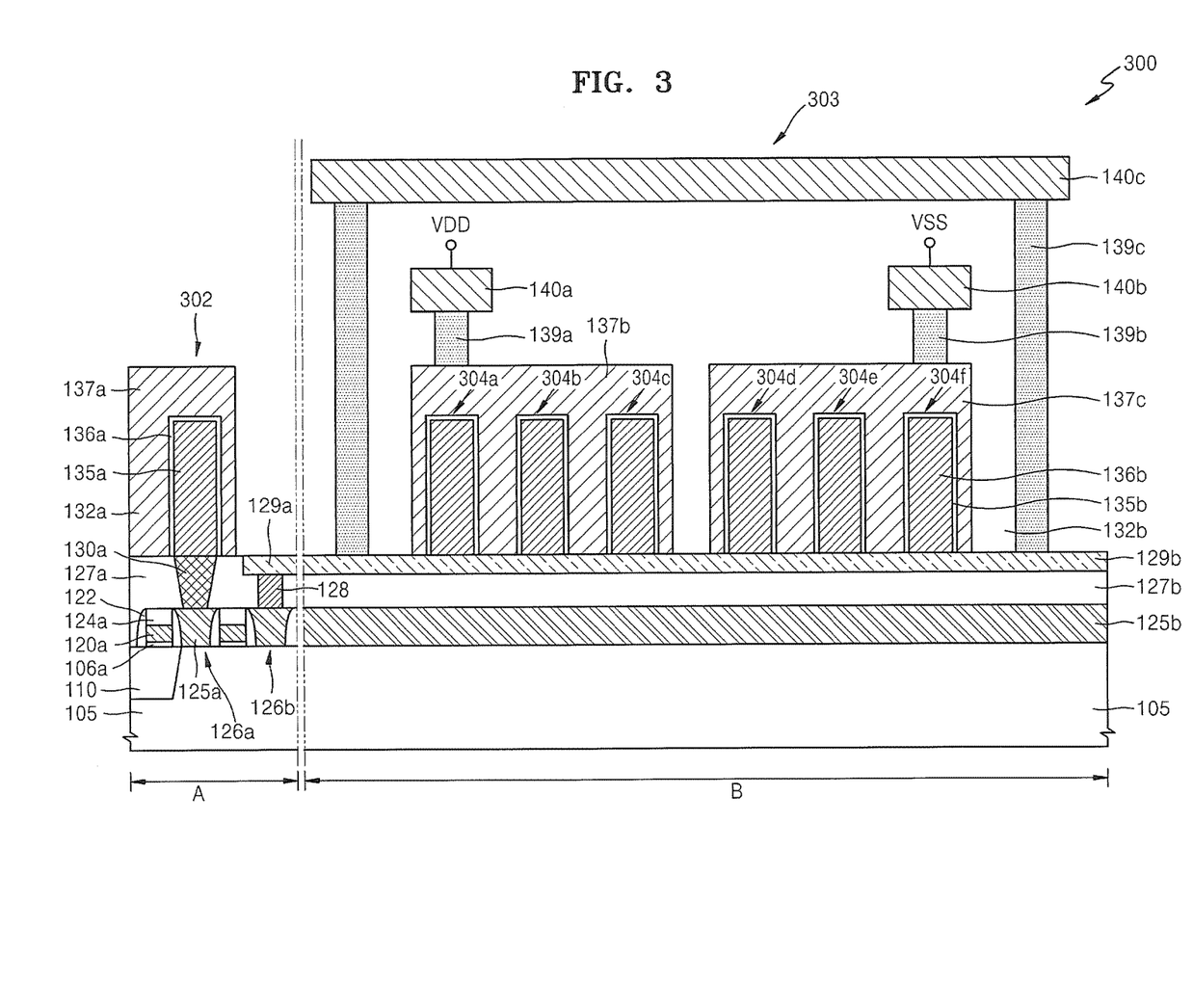
FIG. 3 is a diagram for describing a semiconductor memory device including a PDC, according to various embodiments.

FIG. 3 is a diagram for describing a semiconductor memory device 300 including a PDC 303, according to various embodiments of the inventive concept. For convenience of description, details about elements denoted by the same reference numerals as FIG. 1 are not repeated herein.

In the semiconductor memory device 300 of FIG. 3, a cell capacitor 302 and decoupling capacitors 304a through 304f respectively formed in the cell array region A and the peripheral circuit region B each have a pillar structure. An area of a capacitor electrode is increased by the pillar structure, and the increased area increases a capacitance of a capacitor. In the PDC 303, the decoupling capacitors 304a through 304c and the decoupling capacitors 304d through 304f, which are connected in parallel, use the first conductive layer 129b as a series connection line, i.e., a middle node.

In the PDC 303, the third metal conductive layer 140c is parallel connected to the first conductive layer 129b so as to attenuate the resistance component $R_{BLP}$ of the first conductive layer 129b that is the middle node. The resistance component $R_{METAL}$ of the third metal conductive layer 140c is connected to the resistance component $R_{BLP}$ of the first conductive layer 129b in parallel, so as to attenuate the resistance component $R_{BLP}$ of the first conductive layer 129b. Accordingly, an effective capacitance of the PDC 303 may be prevented from being decreased when the semiconductor memory device 300 operates at a high frequency.

Figure 4:
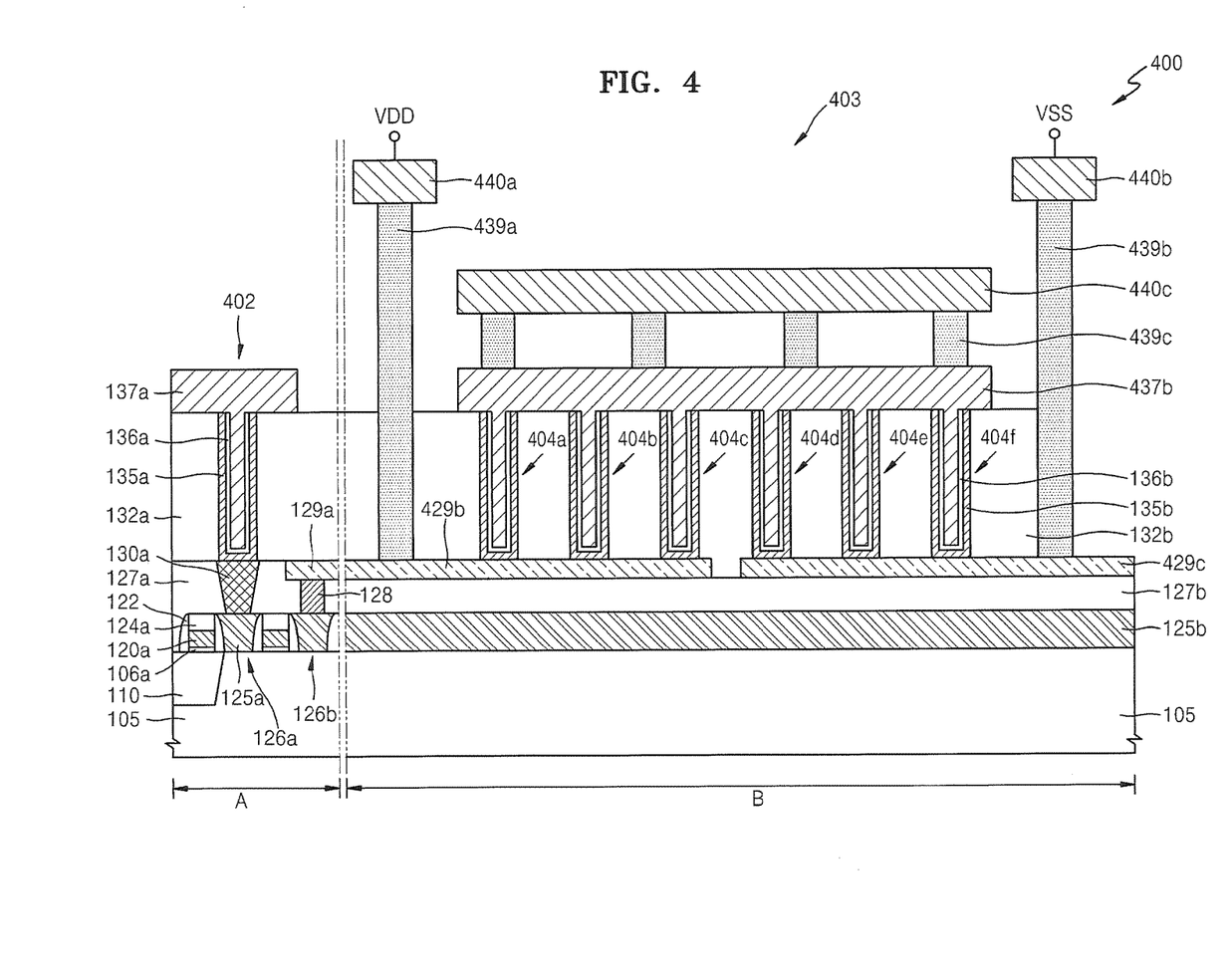
FIG. 4 is a diagram for describing a semiconductor memory device including a PDC, according to various embodiments.

FIG. 4 is a diagram for describing a semiconductor memory device 400 including a PDC 403, according to various embodiments of the inventive concept. For convenience of description, details about elements denoted by the same reference numerals as FIG. 1 are not repeated herein.

In the semiconductor memory device 400 of FIG. 4, a cell capacitor 402 and decoupling capacitors 404a through 404f formed in the cell array region A and the peripheral circuit region B each have a cylindrical structure. The PDC 403 uses a plate electrode 437b of the decoupling capacitors 404d through 404f connected in parallel to the decoupling capacitors 404a through 404c as a series connection line, i.e., a middle node.

The storage electrode 135b of the decoupling capacitors 404a through 404c is connected to a first conductive layer 429b, and the storage electrode 135b of the decoupling capacitors 404d through 404f is connected to a second conductive layer 429c. The plate electrode 437b of the decoupling capacitors 404a through 404f forms a middle node of the PDC 403 by being connected in parallel. For example, the storage electrode 135b and the plate electrode 437b may be formed of polysilicon.

The first and second conductive layers 429b and 429c may be formed on the same level as the bit line 129a formed in the cell array region A, and of the same material as the bit line 129a. For example, the first and second conductive layers 429b and 429c may be formed of polysilicon.

The first conductive layer 429b is connected to a first metal conductive layer 440a through a first metal contact 439a, and the second conductive layer 429c is connected to a second metal conductive layer 440b through a second metal contact 439b. The first metal conductive layer 440a is electrically connected to the external power voltage VDD to apply the external power voltage VDD to the first conductive layer 429b. The second metal conductive layer 440b is electrically connected to the ground voltage VSS to apply the ground voltage VSS to the second conductive layer 429c.

The decoupling capacitors 404a through 404c and the decoupling capacitors 404d through 404f are connected in series through the plate electrode 437b. The PDC 403 schematically has an equivalent circuit shown in FIG. 5.

Figure 5:
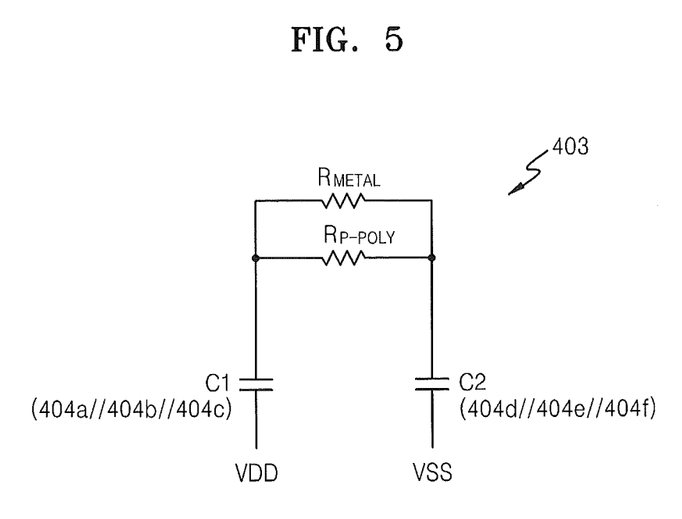
FIG. 5 is an equivalent circuit diagram of the PDC of FIG. 4, according to various embodiments.

FIG. 5 is an equivalent circuit diagram of the PDC of FIG. 4, according to various embodiments. Referring to FIG. 5, the PDC 403 includes the first capacitor C1 including the decoupling capacitors 404a through 404c connected in parallel, and the second capacitor C2 including the decoupling capacitors 404d through 404f connected in parallel. One terminal of the first capacitor C1 is electrically connected to the external power voltage VDD, and one terminal of the second capacitor C2 is electrically connected to the ground voltage VSS. The other terminals of the first and second capacitors C1 and C2 correspond to the plate electrode 437b of FIG. 4.

When a deposition thickness of the plate electrode 437b is decreased during a manufacturing process, a resistance component $R_{P-POLY}$ of the plate electrode 437b is increased. When the resistance component $R_{P-POLY}$ is increased, an effective capacitance of the PDC 403 may be decreased while the semiconductor memory device 400 operates at a high frequency. In order to prevent the effective capacitance of the PDC 403 from being decreased, a third metal conductive layer 440c of FIG. 4 for attenuating the resistance component $R_{P-POLY}$ of the plate electrode 437b that is the middle node of the PDC 403 is connected to the plate electrode 437b.

In FIG. 4, the third metal conductive layer 440c is connected to the plate electrode 437b through a third metal contact 439c. The third metal conductive layer 440c may be formed on the same level as the first and second metal conductive layers 440a and 440c, and of the same material. The first through third metal conductive layers 440a through 440c may be formed of a conductive material having a smaller resistance value than the resistance component $R_{P-POLY}$ of the plate electrode 437b. For example, the first through third metal conductive layers 440a through 440c may be formed of Au, Al, Cr, Ni, W, Ti, Ta, TiW, NiCr, AlNx, TiNx, TiAlxNy, TaNx, WSix, TiSix, CoSix, or a combination thereof.

The third metal conductive layer 440c is connected to the plate electrode 437b in parallel. As shown in FIG. 5, the resistance component $R_{METAL}$ of the third metal conductive layer 440c is connected to the resistance component $R_{P-POLY}$ of the plate electrode 437b in parallel, thereby attenuating the resistance component $R_{P-POLY}$ of the plate electrode 437b. Accordingly, the effective capacitance of the PDC 430 may be prevented from being reduced while the semiconductor memory device 400 operates at a high frequency.

Figure 6:
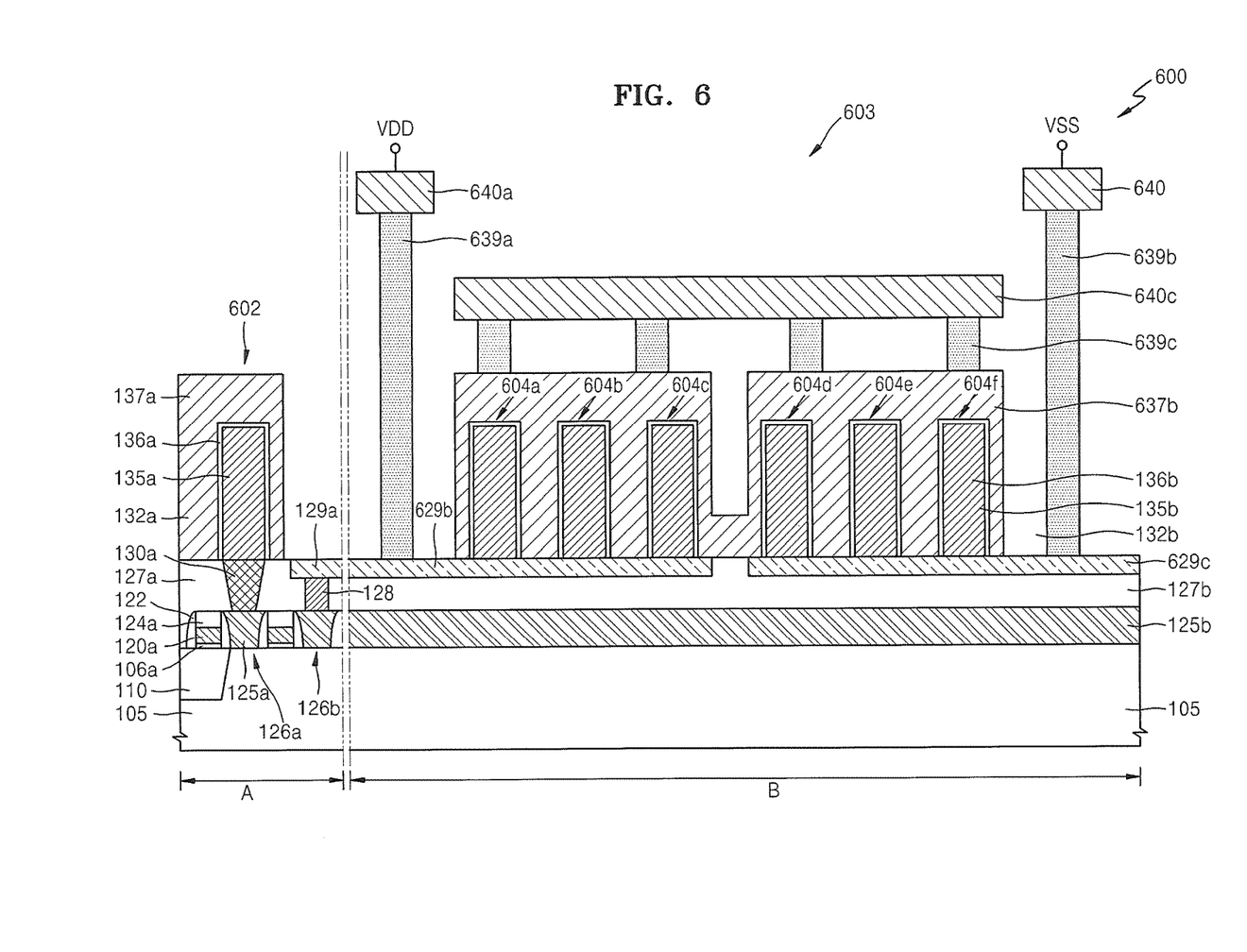
FIG. 6 is a diagram for describing a semiconductor memory device including a PDC, according to various embodiments.

FIG. 6 is a diagram for describing a semiconductor memory device 600 including a PDC 603, according to various embodiments of the inventive concept. For convenience of description, details about elements denoted by the same reference numerals as FIG. 1 are not repeated herein.

In the semiconductor memory device 600 of FIG. 6, a cell capacitor 602 and decoupling capacitors 604a through 604f respectively formed in the cell array region A and the peripheral circuit region B each have a pillar structure. In the PDC 603, the decoupling capacitors 604a through 604c connected in parallel and the decoupling capacitors 604d through 604f connected in parallel use a plate electrode 637b as a series connection line, i.e., a middle node.

In the PDC 603, a third metal conductive layer 640c is parallel connected to the plate electrode 637b through metal contacts 639c so as to attenuate the resistance component $R_{BLP}$ of the plate electrode 637b that is the middle node. The third metal conductive layer 640c is connected to the plate electrode 637b in parallel so as to attenuate the resistance component $R_{BLP}$ of the plate electrode 637b. Accordingly, an effective capacitance of the PDC 603 may be prevented from being reduced while the semiconductor memory device 600 operates at a high frequency.

The first conductive layer 629b is connected to a first metal conductive layer 640a through a first metal contact 639a, and the second conductive layer 629c is connected to a second metal conductive layer 640 through a second metal contact 639b. The first metal conductive layer 640a is electrically connected to the external power voltage VDD to apply the external power voltage VDD to the first conductive layer 629b. The second metal conductive layer 640 is electrically connected to the ground voltage VSS to apply the ground voltage VSS to the second conductive layer 629c.

Figure 7:
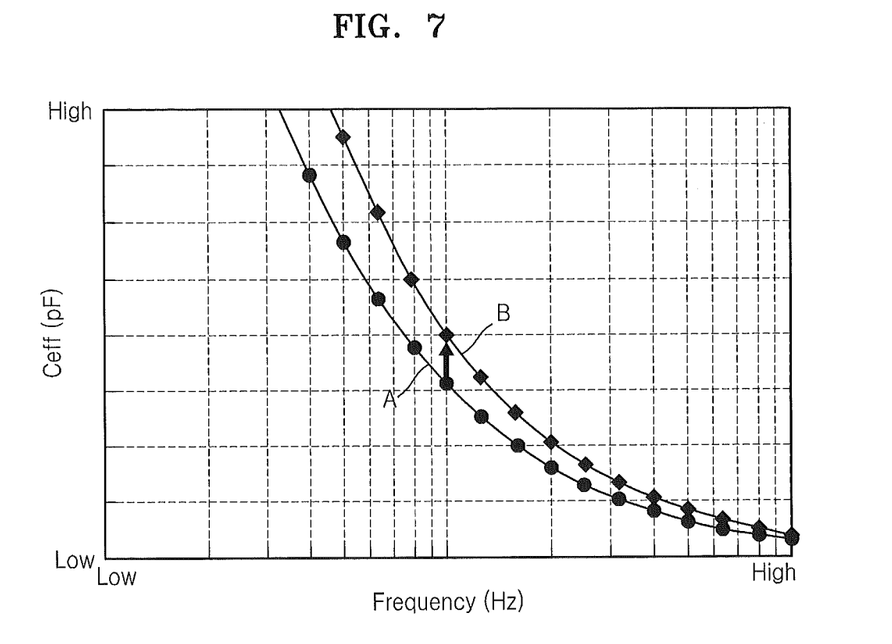
FIG. 7 is a waveform diagram showing results of evaluating effective capacitance characteristics of PDCs, according to various embodiments.

FIG. 7 is a waveform diagram showing results of evaluating effective capacitance characteristics of PDCs, according to various embodiments of the inventive concept.

In FIG. 7, the evaluation is performed on the PDC 603 of FIG. 6, wherein a two-stage cell type PDC, in which cell capacitor type decoupling capacitors are connected in series, is used, and a plate electrode is used as a middle node of the two-stage cell type PDC. A waveform A denotes a case where a third metal conductive layer is not parallel connected to the plate electrode that is the middle node, and a waveform B denotes a case where a third metal conductive layer is parallel connected to the plate electrode that is the middle node. In both waveforms A and B, effective capacitance is remarkably low during a high frequency operation. However, the effective capacitance is decreased less in the waveform B than in the waveform A. As such, a high frequency characteristic of a PDC according to an embodiment of the inventive concept is improved.

Figure 8:
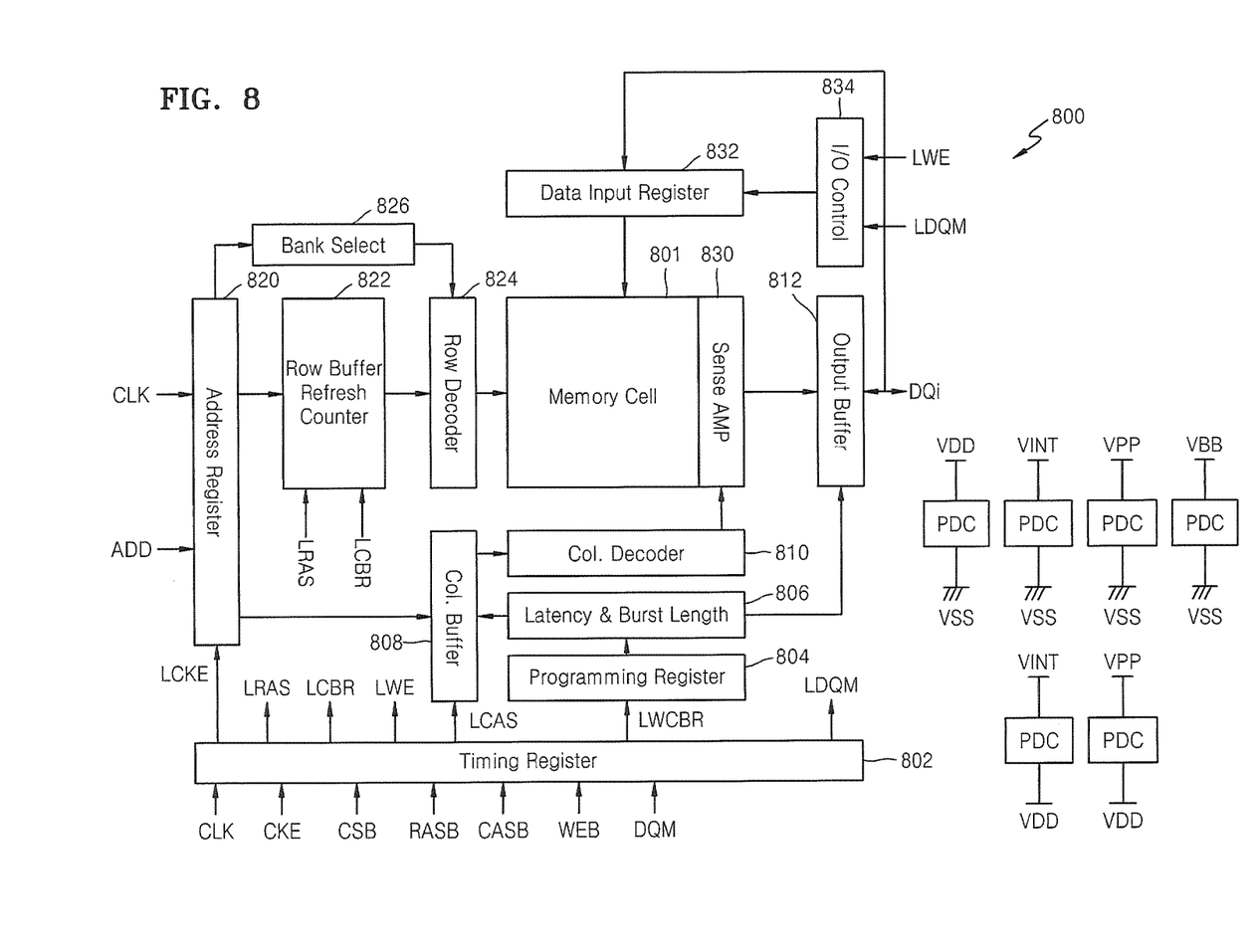
FIG. 8 is a block diagram of a semiconductor memory device including a PDC, according to various embodiments.

PDCs described in one or more embodiments of the inventive concept may be included in a semiconductor memory device, for example, double data rate synchronous dynamic random access memory (DDR-SDRAM) 800 of FIG. 8.

FIG. 8 is a block diagram of a semiconductor memory device including a PDC, according to various embodiments. Referring to FIG. 8, the DDR-SDRAM 800 may include a memory cell array 801 including dynamic random access memory (DRAM) cells, and various circuit blocks for driving the DRAM cells. For example, a timing register 802 may be activated when a chip select signal CS is changed from a deactivation level (for example, logic high) to an activation level (for example, logic low). The timing register 802 may receive external command signals, such as a clock signal CLK, a clock enable signal CKE, a chip select signal CSB, a row address strobe signal RASB, a column address strobe signal CASB, a write enable signal WEB, and a data input/output mask signal DQM, and generate various internal command signals (LRAS, LCBR, LWE, LCAS, LWCBR, and LDQM) for controlling circuit blocks by processing the received external command signals.

Some of the internal command signals generated by the timing register 802 are stored in a programming register 804. For example, latency information or burst length information related to a data output may be stored in the programming register 804. The internal command signals stored in the programming register 804 may be provided to a latency/burst length controller 806, and the latency/burst length controller 806 may provide a control signal for controlling the latency or burst length of the data output to a column decoder 810 or an output buffer 812 through a column buffer 808.

An address register 820 may receive an address signal ADD from outside the DDR-SDRAM 800. A row address signal may be provided to a row decoder 824 through a row buffer 822. Also, a column address signal may be provided to the column decoder 810 through the column buffer 808. The row buffer 822 may further receive a refresh address signal generated by a refresh counter in response to refresh commands LRAS and LCBR, and provide any one of a row address signal and a refresh address signal to the row decoder 824. Also, the address register 820 may provide a bank signal for selecting a bank to a bank selector 826.

The row decoder 824 may decode the row address signal or the refresh address signal received from the row buffer 822, and activate a word line of the memory cell array 801. The column decoder 810 may decode a column address signal, and perform a select operation on a bit line of the memory cell array 801. For example, a column selection line may be applied to the DDR-SDRAM 800, and thus a select operation via the column selection line may be performed.

A sense amplifier 830 may amplify data of a memory cell selected by the row decoder 824 and the column decoder 810, and provide the amplified data to the output buffer 812. Data for recording on the data cell may be provided to the memory cell array 801 through a data input register 832, and an input/output controller 834 may control a data transmitting operation through the data input register 832.

The DDR-SDRAM 800 may use various voltages (VDD, VINT, VPP, and VBB) for driving the memory cell array 801 and various circuit blocks. The external power voltage VDD is external operation power applied to the DDR-SDRAM 800, and an internal power voltage VINT may be generated from the external power voltage VDD and have a lower voltage level than the external power voltage VDD. The internal power voltage VINT may be used as a power voltage of a core block including the memory cell array 801. A high voltage VPP may be generated from the external power voltage VDD and have a higher voltage level than the external power voltage VDD. The high voltage VPP may be used as a voltage for activating a word line of the memory cell array 801. A back bias voltage VBB may be used as a voltage applied to a substrate to prevent a leakage current of a transistor.

The DDR-SDRAM 800 uses a PDC to suppress voltage fluctuation of each of the external power voltage VDD, the internal power voltage VINT, the high voltage VPP, and the back bias voltage VBB. The external power voltage, the internal power voltage VINT, the high voltage VPP, and the back bias voltage VBB may be connected to a first electrode of the PDC, and a ground voltage may be connected to a second electrode of the PDC. Alternatively, the internal power voltage VINT or the high voltage VPP may be connected to the first electrode and the external power voltage VDD may be connected to the second electrode.

The PDC may be a two-stage cell type PDC wherein cell capacitor type decoupling capacitors are connected in series. When a conductive layer on the same level as a bit line and connected to a storage electrode is a middle node, a metal conductive layer may be connected to the conductive layer in parallel so as to attenuate a resistance component of the conductive layer. Alternatively, when a plate electrode is a middle node, a metal conductive layer may be parallel connected to the plate electrode so as to attenuate a resistance component of the plate electrode. Accordingly, an effective capacitance of the PDC may be prevented from being reduced at a high frequency operation.

Figure 9:
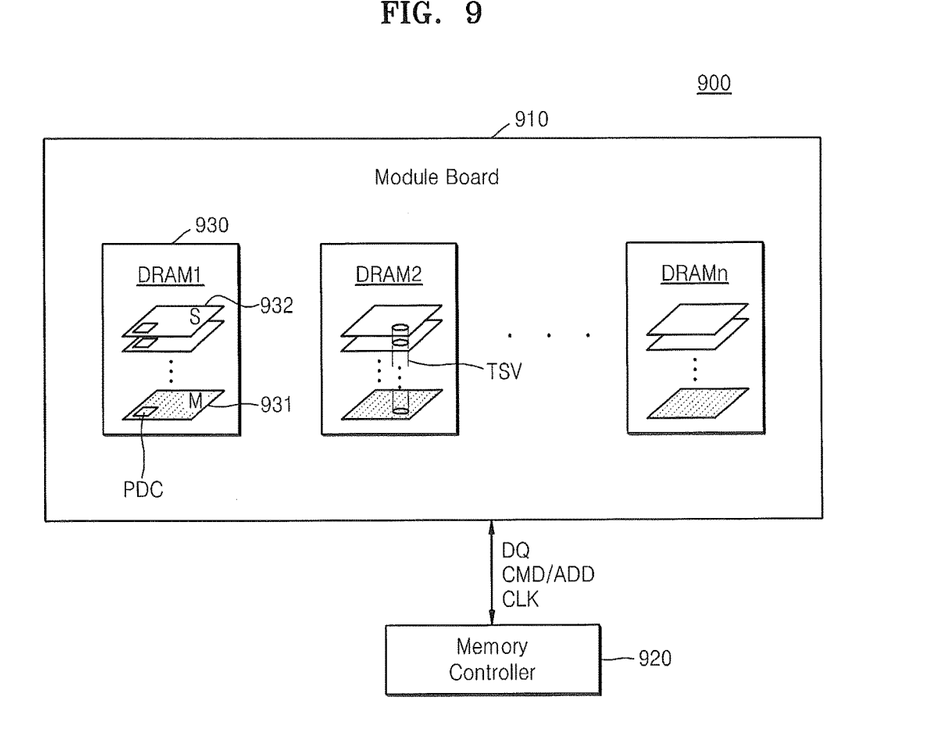
FIG. 9 is a diagram of a memory system to which the semiconductor memory device of FIG. 8 is applied, according to various embodiments.

FIG. 9 is a diagram of a memory system 900 to which the semiconductor memory device of FIG. 8 is applied, according to various embodiments of the inventive concept.

Referring to FIG. 9, the memory system 900 may include a memory 910 and a memory controller 920. In the memory 910, at least one semiconductor memory device 930 may be mounted on a module board. The semiconductor memory device 930 may be realized as a DRAM chip, and include a plurality of semiconductor layers. The semiconductor layers may include at least one master chip 931 and at least one slave chip 932. A signal may be transmitted between the semiconductor layers through a through silicon via (TSV).

The master chip 931 and the slave chip 932 may include a PDC according to one of the embodiments of the inventive concept. The PDC is used to suppress voltage fluctuation of various voltages used in each of the master chip 931 and the slave chip 932. The PDC may be a two-stage cell type PDC wherein cell capacitor type decoupling capacitors are connected in series. When a conductive layer on the same level as a bit line and connected to a storage electrode is a middle node, a metal conductive layer may be connected to the conductive layer in parallel so as to attenuate a resistance component of the conductive layer. Alternatively, when a plate electrode is a middle node, a metal conductive layer may be parallel connected to the plate electrode so as to attenuate a resistance component of the plate electrode. Accordingly, an effective capacitance of the PDC may be prevented from being reduced at a high frequency operation.

The memory module 910 may communicate with the memory controller 920 through a system bus. Data DQ, a command signal CMD, an address signal ADD, a clock signal CLK, etc. may be transmitted between the memory module 910 and the memory controller 920 through the system bus.

Figure 10:
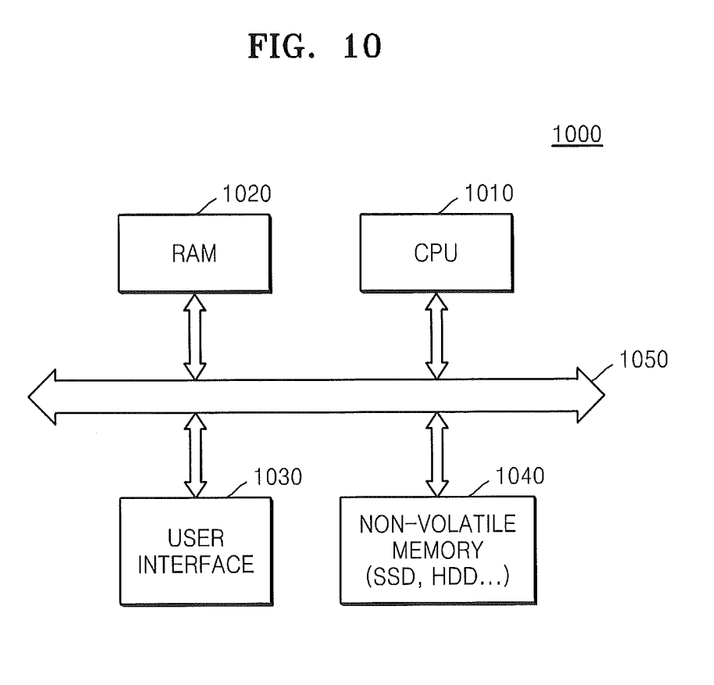
FIG. 10 is a block diagram of a computer system to which a memory system is installed, according to various embodiments of the inventive concept.

FIG. 10 is a block diagram of a computer system 1000 to which a memory system is installed, according to various embodiments of the inventive concept.

Referring to FIG. 10, a semiconductor memory device may be mounted as RAM 1020, on the computer system 1000, such as a mobile device or a desktop computer. The semiconductor memory device mounted as the RAM 1020 may be according to any one of the embodiments described above. For example, the RAM 1020 may be the semiconductor memory device according to one of the embodiments, or may be applied in a form of a memory module. Alternatively, the RAM 1020 may include both a semiconductor memory device and a memory controller.

The computer system 1000 according to an embodiment includes a central processing unit (CPU) 1010, the RAM 1020, a user interface 1030, and a non-volatile memory 1040, which are electrically connected to a bus 1050. A process result of the CPU 1010 may be stored in the RAM 1020 and/or the non-volatile memory 1040. The user interface 1030 may include input devices and output devices. Examples of the input devices include a keyboard and a camera, and input data may be a command from a user or multimedia data, such as image data of a camera. The input data may be stored in the RAM 1020 and/or the non-volatile memory 1040. The output devices output data stored in the RAM 1020 or the non-volatile memory 1040. Examples of the output devices include a display device and a speaker. The non-volatile memory 1040 may be a large capacity storage device, such as a solid state disk (SSD) or a hard disk drive (HDD).

In the computer system 1000, the RAM 1020 may include a PDC according to one of the embodiments of the inventive concept. The PDC is used to suppress voltage fluctuation of various voltages used in the RAM 1020. The PDC may be a two-stage cell type PDC wherein cell capacitor type decoupling capacitors are connected in series. When a conductive layer on the same level as a bit line and connected to a storage electrode is a middle node, a metal conductive layer may be connected to the conductive layer in parallel so as to attenuate a resistance component of the conductive layer. Alternatively, when a plate electrode is a middle node, a metal conductive layer may be parallel connected to the plate electrode so as to attenuate a resistance component of the plate electrode. Accordingly, an effective capacitance of the PDC may be prevented from being reduced at a high frequency operation.

According to one or more embodiments of the inventive concept, a resistance component of a metal conductive layer may be set to be smaller than a resistance component of a plate electrode.

While the inventive concept has been particularly shown and described with reference to exemplary embodiments thereof, it will be understood that various changes in form and details may be made therein without departing from the spirit and scope of the following claims.

What is claimed is:

1. A semiconductor memory device comprising:
a cell array region comprising a cell transistor, a bit line electrically connected to a source/drain region of the cell transistor, and a cell capacitor; and
a peripheral circuit region comprising a power decoupling capacitor that comprises:
a plurality of decoupling capacitors disposed at the same level as the cell capacitor of the cell array region, wherein the plurality of decoupling capacitors comprise a plurality of lower electrodes, respectively, and wherein first ones of the plurality of decoupling capacitors are electrically connected to each other in parallel and comprise a first capacitor, and second ones of the plurality of decoupling capacitors are electrically connected to each other in parallel and comprise a second capacitor;
a conductive layer disposed at the same level as the bit line of the cell array region, wherein ones of the plurality of lower electrodes of the first capacitor and ones of the plurality of lower electrodes of the second capacitor are electrically connected to the conductive layer; and
a metal conductive layer electrically connected to the conductive layer,
wherein the conductive layer and the metal conductive layer are electrically connected to each other in parallel between the first capacitor and the second capacitor, and
wherein the first capacitor and the second capacitor are electrically connected to each other in series through the conductive layer and the metal conductive layer.

2. The semiconductor memory device of claim 1, wherein the conductive layer comprises a same material as the bit line.

3. The semiconductor memory device of claim 1, wherein a resistance component of the metal conductive layer is smaller than a resistance component of the conductive layer.

4. The semiconductor memory device of claim 1, wherein the power decoupling capacitor is configured to suppress fluctuation of an operation power voltage of the semiconductor memory device.

5. The semiconductor memory device of claim 1, wherein the plurality of decoupling capacitors further comprise a first upper electrode of the first capacitor and a second upper electrode of the second capacitor, and
wherein the first upper electrode is configured to be electrically connected to a first voltage and the second upper electrode is configured to be electrically connected to a second voltage.

6. The semiconductor memory device of claim 5, wherein the first voltage is any one of an external power voltage applied from outside the semiconductor memory device, an internal power voltage having a voltage level lower than the external power voltage, a high voltage having a voltage level higher than the external power voltage, and a back bias voltage, and the second voltage is a ground voltage.

7. The semiconductor memory device of claim 5, wherein the first voltage is an external power voltage applied from outside the semiconductor memory device, and the second voltage is an internal power voltage having a voltage level lower than the external power voltage or a high voltage having a voltage level higher than the external power voltage.

8. The semiconductor memory device of claim 1, wherein the cell capacitor comprises a storage electrode, and
wherein each of the storage electrode of the cell capacitor and the plurality of lower electrodes of the plurality of decoupling capacitors has a cylindrical shape.

9. The semiconductor memory device of claim 1, wherein the cell capacitor comprises a storage electrode, and
wherein each of the storage electrode of the cell capacitor and the plurality of lower electrodes of the plurality of decoupling capacitors has a pillar shape.

10. The semiconductor memory device of claim 1, wherein the ones of the plurality of lower electrodes of the first capacitor and the ones of the plurality of lower electrodes of the second capacitor directly contact the conductive layer.

11. The semiconductor memory device of claim 1, wherein the conductive layer and the metal conductive layer are spaced apart from each other in a vertical direction that is substantially perpendicular to an upper surface of the conductive layer, and
wherein the first capacitor and the second capacitor are between the conductive layer and the metal conductive layer.

12. A semiconductor memory device comprising:
a cell array region comprising a cell transistor, a bit line electrically connected to a source/drain region of the cell transistor, and a cell capacitor; and
a peripheral circuit region comprising a power decoupling capacitor that comprises:
a plurality of decoupling capacitors, wherein the plurality of decoupling capacitors comprise first ones of the plurality of decoupling capacitors that are electrically connected to each other in parallel and comprise a first capacitor and second ones of the plurality of decoupling capacitors that are electrically connected to each other in parallel and comprise a second capacitor;
a conductive layer disposed at the same level as the bit line of the cell array region; and
a metal conductive layer electrically connected to the conductive layer,
wherein the conductive layer and the metal conductive layer are electrically connected to each other in parallel between the first capacitor and the second capacitor, and
wherein the first capacitor and the second capacitor are electrically connected to each other in series through the conductive layer and the metal conductive layer.

13. The semiconductor memory device of claim 12, wherein a resistance component of the metal conductive layer is less than a resistance component of the conductive layer.

14. The semiconductor memory device of claim 12, wherein the metal conductive layer is thicker than the conductive layer.

15. The semiconductor memory device of claim 12, wherein the first ones of the plurality of decoupling capacitors comprise a plurality of first lower electrodes, respectively, and a first upper electrode that encloses the plurality of first lower electrodes, and
wherein the second ones of the plurality of decoupling capacitors comprise a plurality of second lower electrodes, respectively, and a second upper electrode that encloses the plurality of second lower electrodes.

16. The semiconductor memory device of claim 12, wherein the bit line and the conductive layer comprise a same material.

17. The semiconductor memory device of claim 12, wherein the conductive layer and the metal conductive layer are spaced apart from each other in a vertical direction that is substantially perpendicular to an upper surface of the conductive layer, and
wherein the first capacitor and the second capacitor are between the conductive layer and the metal conductive layer.

18. The semiconductor memory device of claim 12, wherein the first ones of the plurality of decoupling capacitors comprise a plurality of first lower electrodes, respectively, and the second ones of the plurality of decoupling capacitors comprise a plurality of second lower electrodes, respectively, and
wherein the plurality of first lower electrodes and the plurality of second lower electrodes are electrically connected to the conductive layer and the metal conductive layer.

19. The semiconductor memory device of claim 18, wherein the plurality of first lower electrodes and the plurality of second lower electrodes directly contact the conductive layer.

20. The semiconductor memory device of claim 12, wherein the first ones of the plurality of decoupling capacitors comprise a first upper electrode, and the second ones of the plurality of decoupling capacitors comprise a second upper electrode,
wherein the first upper electrode is configured to be electrically connected to one of an external power voltage applied from outside the semiconductor memory device, an internal power voltage having a voltage level lower than the external power voltage, a high voltage having a voltage level higher than the external power voltage, and
wherein the second upper electrode is configured to be electrically connected to a ground voltage.

* * * * *